US010528885B2

(12) United States Patent
Chow et al.

(10) Patent No.: US 10,528,885 B2
(45) Date of Patent: Jan. 7, 2020

(54) CROSS-RESONANCE FAN-OUT FOR EFFICIENCY AND HARDWARE REDUCTION

(71) Applicant: International Business Machines Corporation, Armonk, NY (US)

(72) Inventors: Jerry M. Chow, White Plains, NY (US); Antonio D. Corcoles-Gonzalez, Mount Kisco, NY (US); Jay M. Gambetta, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/720,927

(22) Filed: Sep. 29, 2017

(65) Prior Publication Data

US 2019/0102691 A1 Apr. 4, 2019

(51) Int. Cl.
*G06N 10/00* (2019.01)
*H01P 1/213* (2006.01)
(Continued)

(52) U.S. Cl.
CPC ............. *G06N 10/00* (2019.01); *H01P 1/213* (2013.01); *H03D 7/00* (2013.01); *H03K 3/02* (2013.01)

(58) Field of Classification Search
CPC ...... H01P 1/213; H01P 1/2131; H01P 1/2133; H01P 1/2135; H01P 1/2136;
(Continued)

(56) References Cited

U.S. PATENT DOCUMENTS

| 6,411,212 B1 * | 6/2002 | Hecht ................ G06K 7/10178 340/572.1 |
| 7,515,896 B1 * | 4/2009 | Sorrells .................... H03D 7/00 375/343 |

(Continued)

FOREIGN PATENT DOCUMENTS

| EP | 3059864 A1 | 8/2016 |
| JP | 4777718 B2 | 9/2011 |

(Continued)

OTHER PUBLICATIONS

Analog Devices (Mixers and Modulators MT-080 Tutorial, 2009) (Year: 2009).*

(Continued)

*Primary Examiner* — Patrick C Chen
(74) *Attorney, Agent, or Firm* — Cantor Colburn LLP; Noah Sharkan

(57) ABSTRACT

A signal generating system is provided. The signal generating system provides a microwave signal to a plurality of qubits. The signal generating system includes a generator, an oscillator, a mixer, and a splitter. The oscillator generates an oscillator signal including a constant frequency. The generator generates a generator signal including an initial frequency. The mixer is electrically coupled to the generator and the oscillator. The mixer combines the generator and oscillator signals to produce the microwave signal. The splitter is electrically coupled to the mixer. The splitter fans-out the microwave signal to a plurality of physical lines. Each of the plurality of physical lines is electrically connected to a corresponding one of the plurality of qubits.

20 Claims, 7 Drawing Sheets

(51) Int. Cl.
*H03D 7/00* (2006.01)
*H03K 3/02* (2006.01)

(58) Field of Classification Search
CPC ........ H01P 1/2138; H03D 7/00; H03D 7/005;
H03D 7/02; H03D 7/04; H03D 7/06;
H03D 7/08; H03D 7/10; G06N 99/002;
G06N 10/00
USPC ........................................................ 327/113
See application file for complete search history.

(56) References Cited

U.S. PATENT DOCUMENTS

| | | |
|---|---|---|
| 8,111,083 B1 | 2/2012 | Pesetski et al. |
| 2001/0056350 A1* | 12/2001 | Calderone ............ G06Q 20/102 704/270 |
| 2009/0014714 A1 | 1/2009 | Koch |
| 2009/0015317 A1 | 1/2009 | DiVincenzo et al. |
| 2013/0163322 A1* | 6/2013 | Lam .................... G11C 11/5678 365/163 |
| 2018/0013426 A1* | 1/2018 | Deurloo .................. G06F 15/82 |

FOREIGN PATENT DOCUMENTS

| | | |
|---|---|---|
| WO | 2014028302 A2 | 2/2014 |
| WO | 2016133394 A1 | 8/2016 |

OTHER PUBLICATIONS

P201705888, PCT Search Report dated Jun. 15, 2018, PCT Application No. PCT/EP2017/083549, 14 pages.

Christopher Skach, Sahand Noorizadeh, How New DAC Technologies are Changing Signal Generation for Test, Electric Design, Technologies Test & Measurement, May 10, 2017, 8 pages (http://www.electronicdesign.com/test-measurement/how-new-dac-technologies-are-changing-signal-generation-test).

* cited by examiner

CROSS-RESONANCE FAN-OUT FOR EFFICIENCY AND HARDWARE REDUCTION

BACKGROUND

The present invention relates to quantum computing, and more specifically, to cross-resonance fan-out for efficiency and hardware reduction with respect to quantum computers.

Quantum computing has emerged based on its applications in, for example, cryptography, molecular modeling, materials science condensed matter physics, and various other fields, which currently stretch the limits of existing high-performance computing resources for computational speedup. At the heart of a quantum computing machines lies the utilization of qubits (i.e., quantum bits), whereby a qubit may, among other things, be considered the analogue of a classical bit (i.e., digital bit—'0' or '1') having two quantum mechanical states (e.g., a high state and a low state) such as the spin states of an electron (i.e., '1'=↑ and '0'=↓), the polarization states of a photon (i.e., '1'=H and '0'=V), or the ground state ('0') and first excited state ('1') of a transmon, which is a superconducting resonator made from a capacitor in parallel with a Josephson junction acting as a non-linear inductor. Although qubits are capable of storing classical '1' and '0' information, they also present the possibility of storing information as a superposition of '1' and '0' states.

For quantum computing machines, scalability of control hardware for quantum computers currently imposes an important hurdle towards the realization of fault-tolerant universal quantum computers. Reducing the control instrumentation resources is critical for viability of these machines.

SUMMARY

According to one or more embodiments of the present invention, a signal generating system is provided. The signal generating system provides a microwave signal to a plurality of qubits. The signal generating system includes a generator, an oscillator, a mixer, and a splitter. The oscillator generates an oscillator signal including a constant frequency. The generator generates a generator signal including an initial frequency. The mixer is electrically coupled to the generator and the oscillator. The mixer combines the generator and oscillator signals to produce the microwave signal. The splitter is electrically coupled to the mixer. The splitter fans-out the microwave signal to a plurality of physical lines. Each of the plurality of physical lines is electrically connected to a corresponding one of the plurality of qubits.

According to one or more embodiments of the present invention, a signal generating method is provided. The signal generating method provides a microwave signal to a plurality of qubits. The signal generating method includes generating, by an oscillator, an oscillator signal comprising a constant frequency. The signal generating method includes generating, by a generator, a generator signal comprising an initial frequency. The signal generating method includes combining, by a mixer electrically coupled to the generator and the oscillator, the generator and oscillator signals to produce the microwave signal. The signal generating method includes fanning-out, by a splitter electrically coupled to the mixer, the microwave signal to a plurality of physical lines. Each of the plurality of physical lines being electrically connected to a corresponding one of the plurality of qubits.

According to one or more embodiments of the present invention, a quantum computer is provided. The quantum computer includes a plurality of qubits; a plurality of physical lines; and a signal generating system. Each of the plurality of physical lines is electrically connected to a corresponding one of the plurality of qubits. The signal generating system provides a microwave signal to the plurality of qubits. The signal generating system includes a generator, an oscillator, a mixer, and a splitter. The oscillator generates an oscillator signal including a constant frequency. The generator generates a generator signal including an initial frequency. The mixer is electrically coupled to the generator and the oscillator. The mixer combines the initial and oscillator signals to produce the microwave signal. The splitter is electrically coupled to the mixer. The splitter fans-out the microwave signal to a plurality of physical lines.

According to one or more embodiments of the present invention, a quantum computer is provided. The quantum computer includes a plurality of qubits; a plurality of physical lines; an oscillator circuit; and a plurality of signal generating nodes. Each of the plurality of physical lines is electrically connected to a corresponding one of the plurality of qubits. The plurality of signal generating nodes each independently provides a respective microwave signal in time to at least one of the plurality of qubits. The oscillator circuit is electrically coupled to the plurality of signal generating nodes. The oscillator circuit generates an oscillator signal including a constant frequency. Each of the signal generating nodes includes a generator, a mixer, and a splitter. The generator generates a generator signal. The mixer electrically is coupled to the generator and the oscillator circuit. The mixer combines the generator and the oscillator signal to produce the respective microwave signal. The splitter electrically is coupled to the mixer. The splitter fans-out the respective microwave signal to a subset of the plurality of physical lines.

According to one or more embodiments of the present invention, a signal generating method is provided. The signal generating method provides a plurality of microwave signals to a plurality of qubits. The signal generating method includes generating, by an oscillator circuit, an oscillator signal. The oscillator signal includes a constant frequency. The signal generating method includes generating, by a plurality of signal generating nodes, a plurality of generator signals. The signal generating method includes fanning-out, via a splitter of the oscillator circuit, the oscillator signal to the plurality of signal generating nodes. The signal generating method includes mixing, by each of the plurality of signal generating nodes, the oscillator signal received from the oscillator circuit and a respective generator signal of the plurality of generator signals to produce the plurality of microwave signals.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

DETAILED DESCRIPTION

Figure 1:
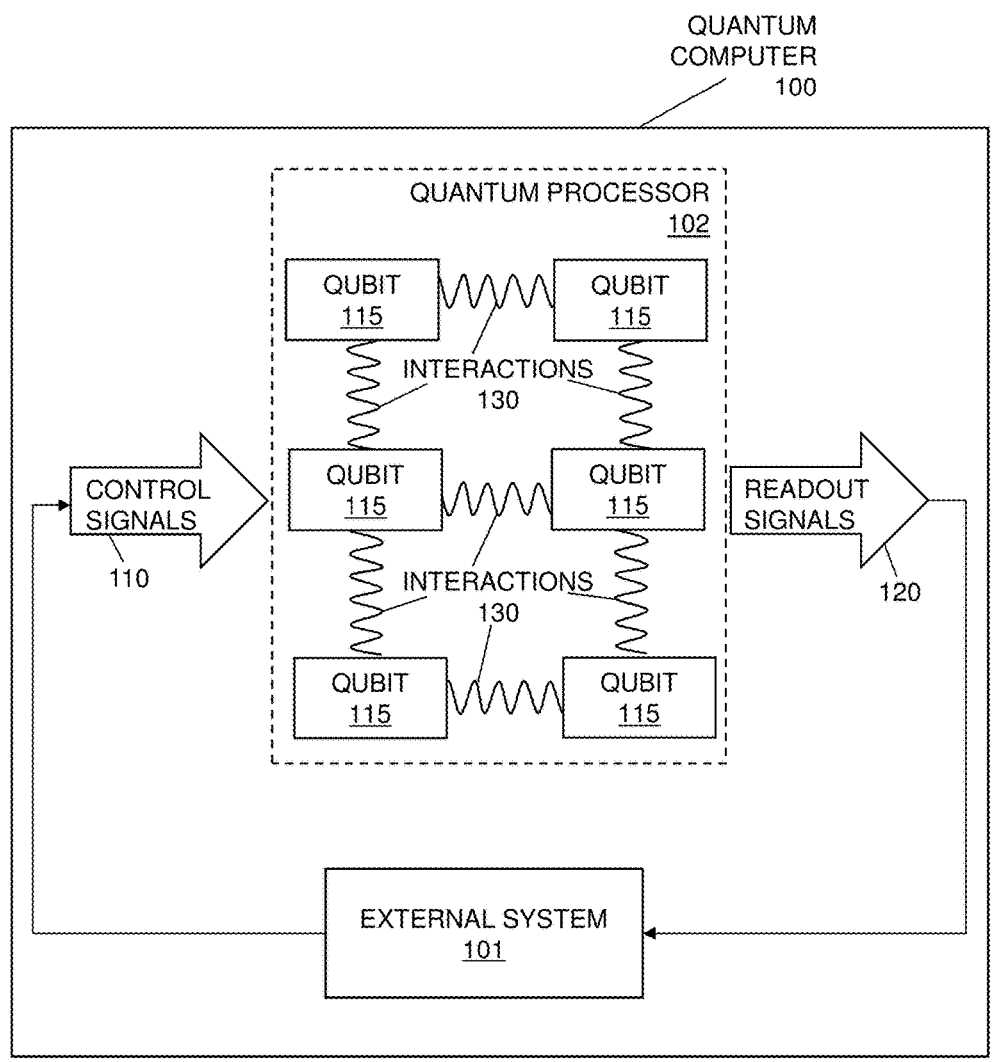
FIG. 1 depicts a diagram of a quantum computer according to one or more embodiments of the present invention.

FIG. 1 depicts a diagram of a quantum computer 100 (quantum hardware) that processes an output from an external system 101 according to according to one or more embodiments of the present invention. The external system 101 is a set of instruments and/or computers programmed and configured to execute encoding for quantum computer 100 and any other (preparation) computations that are not performed on the quantum computer 100. The quantum computer 100 includes a quantum processor 102. The quantum processor 102 is a computing device that can harness quantum physical phenomena (such as superposition, entanglement, and quantum tunneling) unavailable to non-quantum devices, e.g., the actual hardware that embodies the quantum mechanics. The quantum processor 102 can take the form of, for example, a superconducting quantum processor.

In general, a superconducting quantum processor may include a number of qubits and associated local bias devices, for instance two or more superconducting qubits. An example of a qubit is a flux qubit. A superconducting quantum processor may also employ coupling devices (i.e., "couplers") providing communicative coupling between qubits.

Returning to FIG. 1, the quantum computer 100 can be any electronic system that makes direct use of quantum-mechanical phenomena, such as superposition and entanglement, to perform operations on data (e.g., perform quantum computations using quantum bits on data). The requirements can include, but are not limited to, a scalable physical system with well-characterized qubits, the ability to initialize the state of the qubits to a simple fiducial state, long relevant decoherence times, a "universal" set of quantum gates, a qubit-specific measurement capability, the ability to inter-convert stationary and flying qubits, and the ability to faithfully transmit flying qubits between specified locations.

The quantum processor 102 receives control signals 110 (from a control program operated by the external system 101). The quantum processor 102 includes qubits 115 that generate readout signals 120, as an output or measurement data, which can be utilized by the external system 101. Note that the qubits 115 are coupled by the interactions 130. The number of qubits 115, the interaction 130 of the qubits 115, and the configuration of the qubits 115 are for example purposes and are not limiting. It should be appreciated that the qubits 115 (and readout resonators which are not shown in FIG. 1) can be constructed in various different configurations and FIG. 1 is not meant to be limiting. In addition, while FIG. 1 does not show every component and electrical connection of the quantum computer 100 and an artisan would readily understand that noted configuration in the context of the quantum computing.

In operation, the quantum processor 102 can be configured to receive control signals 110 as information that is applied in a sequence to quantum gates (not shown) in support of measurement operations (e.g., program input gate sequence). The quantum gates between different qubits 115 are mediated through their respective interactions 130. The measurement operators produce the readout signals 120 (as measurement data) that can be read by an experimenter controlling the quantum computer 100 and the external system 101.

Figure 2:
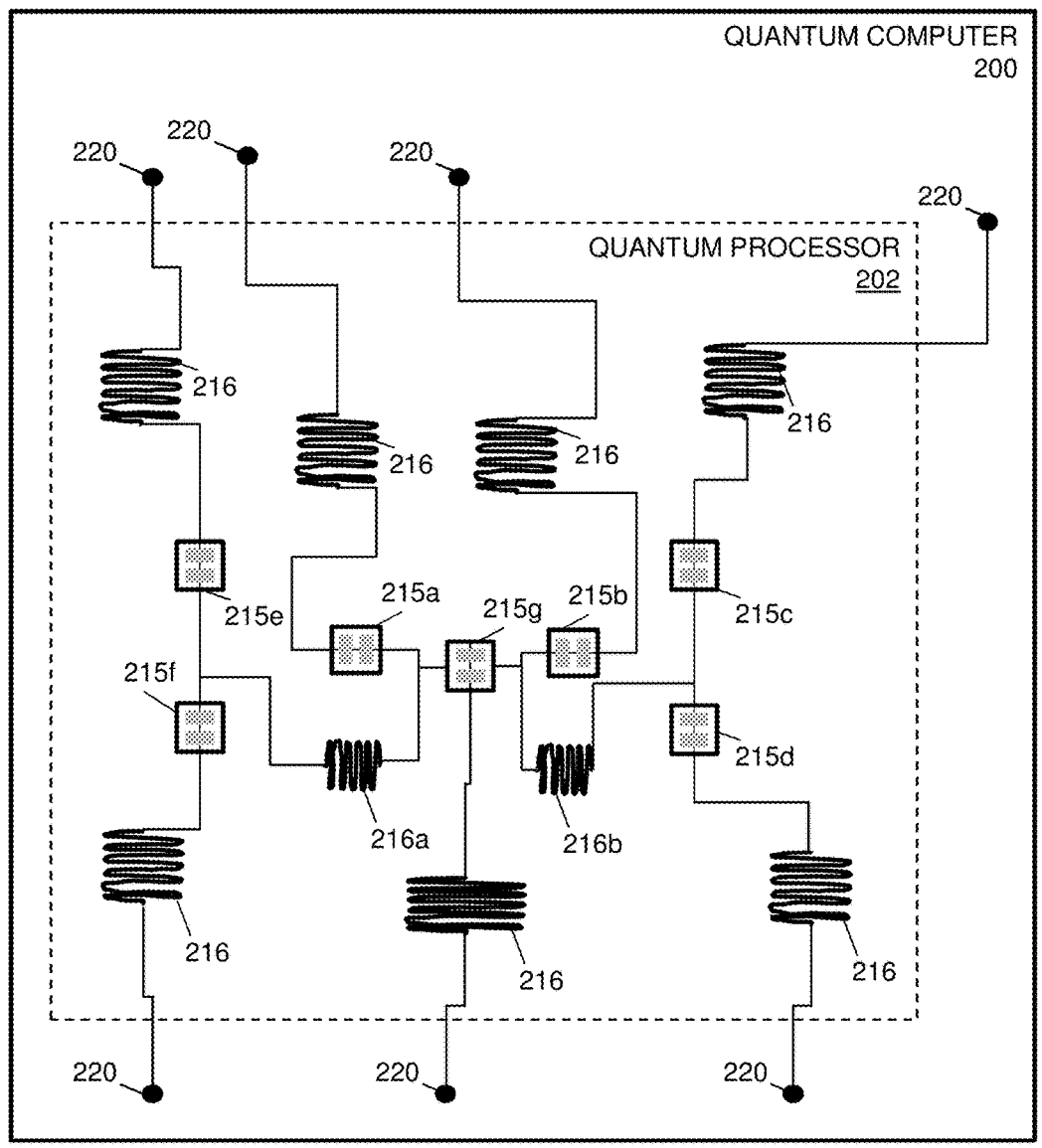
FIG. 2 depicts a diagram of a quantum computer according to one or more embodiments of the present invention.

Turning now to FIG. 2, a diagram of a quantum computer 200 is depicted according to one or more embodiments of the present invention. The structure of the quantum computer 200 as depicted in FIG. 2 and described herein is for explanation of one or more embodiments, and not limiting the technical solutions described herein. As depicted, the quantum computer 200 includes a quantum processor 202 comprising transmon qubits 215. In the illustrated structure, the quantum computer 200 includes six fixed frequency transmon qubits (215a-215b) and a central flux-tunable asymmetric transmon qubit (215g).

Each of the transmon qubits 215 can have its own individual coplanar waveguide (CPW) resonator 216 for receiving control signals (110 of FIG. 1) and providing readout signals (120 of FIG. 1). The transmon qubits 215 are readout by dispersive measurements through the independent readout resonators, with each readout line 220 further having a sequence of low temperature amplifiers (not shown; a Josephson parametric converter followed by a high electron mobility transistor for achieving high assignment fidelity). In accordance with one or more embodiments, the transmon qubits 215 are controlled by microwave pulses that are delivered from electronics via attenuated coaxial lines (not shown). The single qubit gates can be implemented by microwave drives at that specific qubit frequency ($\omega_i/2\pi$), while the entangling two-qubit cross resonance (CR) gates (not shown) are implemented by driving a control qubit at a frequency $\omega_t$ of the target qubit. Further, a state of each of the transmon qubits 215 can be measured at its readout resonator frequency $\omega_{Mi}$. The reflected readout signals (120 of FIG. 1) are amplified first by the corresponding Josephson parametric converter, pumped at a frequency $\omega_{Pi}$, followed by the corresponding high electron mobility transistor amplifiers, for example at 4K. Each of the transmon qubit 215 has corresponding characteristics, which are known constants, and/or preconfigured values for particular applications, the characteristics including qubit transitions ($\omega_{01}/2\pi$), average relaxation times ($T_1$), average coherence times ($T_2$, $T_2^*$), readout resonator frequencies ($\omega_r/2\pi$), qubit anharmonicity ($\delta/2\pi$), readout assignment errors ($\varepsilon_r$), among others.

Further, the quantum computer 200 includes two shared CPW resonators 216a and 216b (quantum buses) for qubit-qubit coupling. It should be noted that although FIG. 2 depicts two shared CPW resonators 216a and 216b implementing as one or more entanglers, in other examples, more resonators may be used to implement an entangler. Note that the two shared CPW resonators 216a and 216b (quantum busses) mediate the qubit-qubit interactions that are exploited by the entangling operations, for example.

In accordance with one or more embodiments of the present invention, the entangler may or may not include a single qubit gate, along with two-qubit gates. The gates that constitute the entanglers are implemented by driving a control qubit with a microwave pulse that is resonant with a target qubit. With the addition of single qubit rotations, the CR gate can be used to construct a controlled NOT (CNOT).

Figure 3:
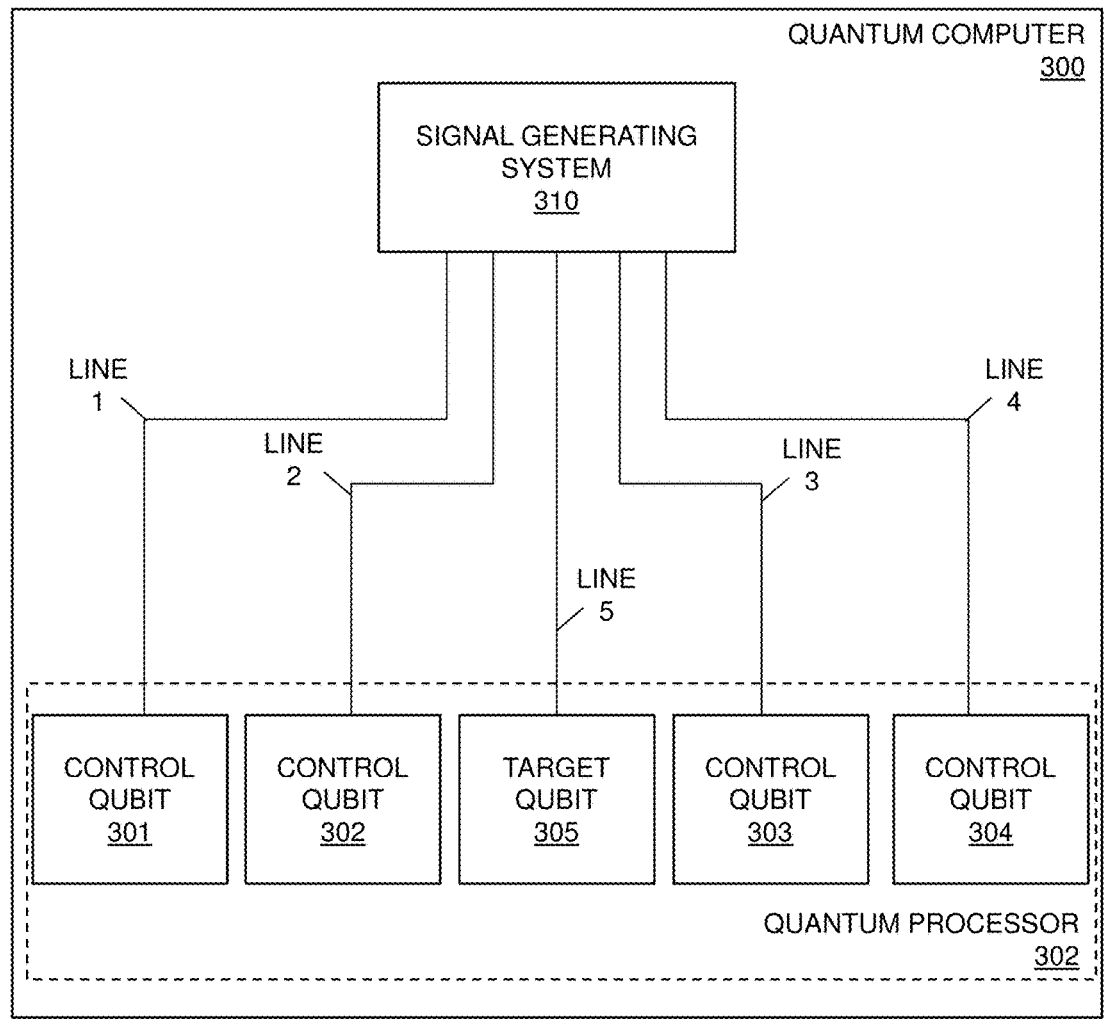
FIG. 3 depicts a diagram of a quantum computer according to one or more embodiments of the present invention.
Figure 4:
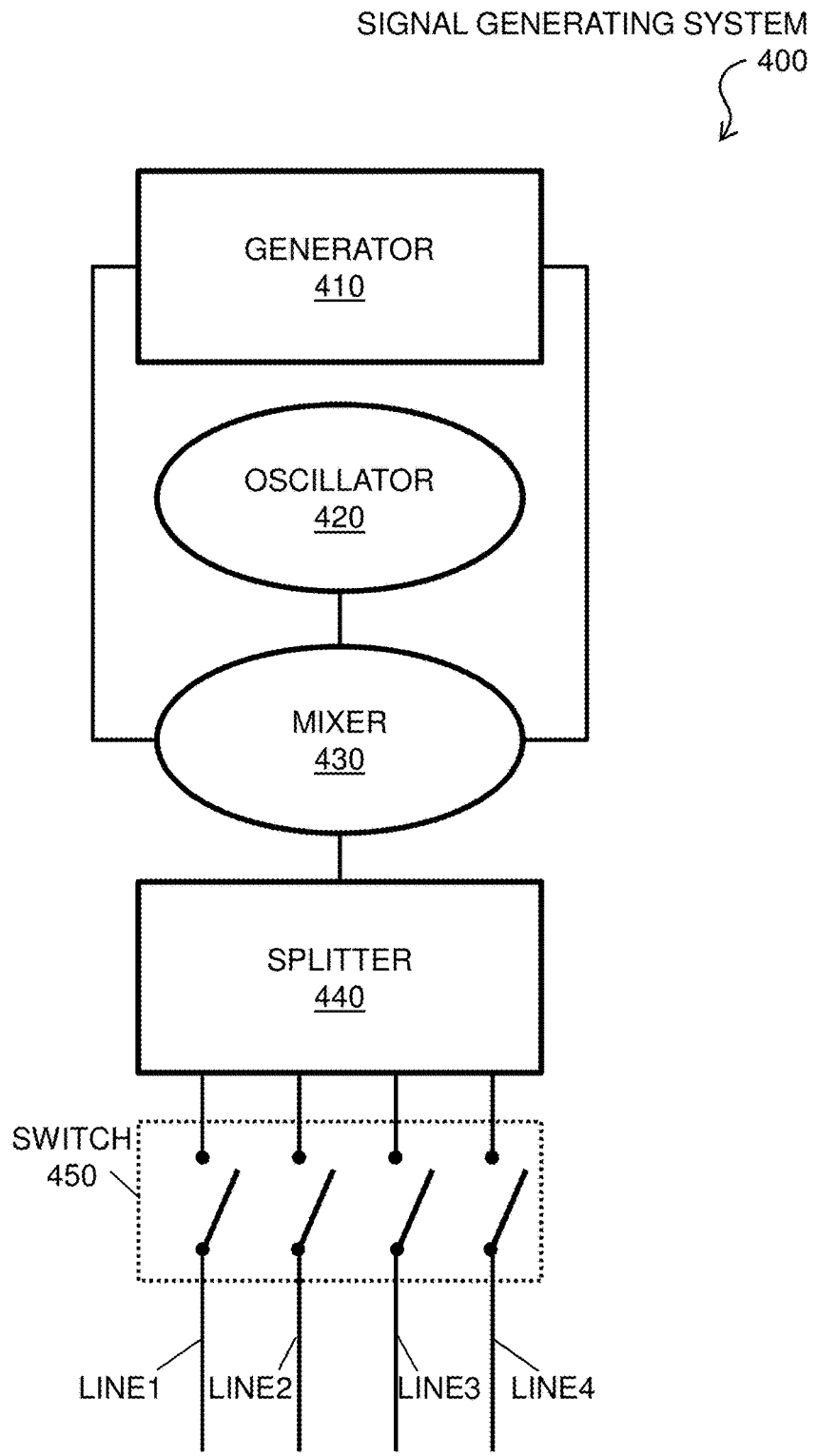
FIG. 4 depicts a diagram of a signal generating system according to one or more embodiments of the present invention.
Figure 5:
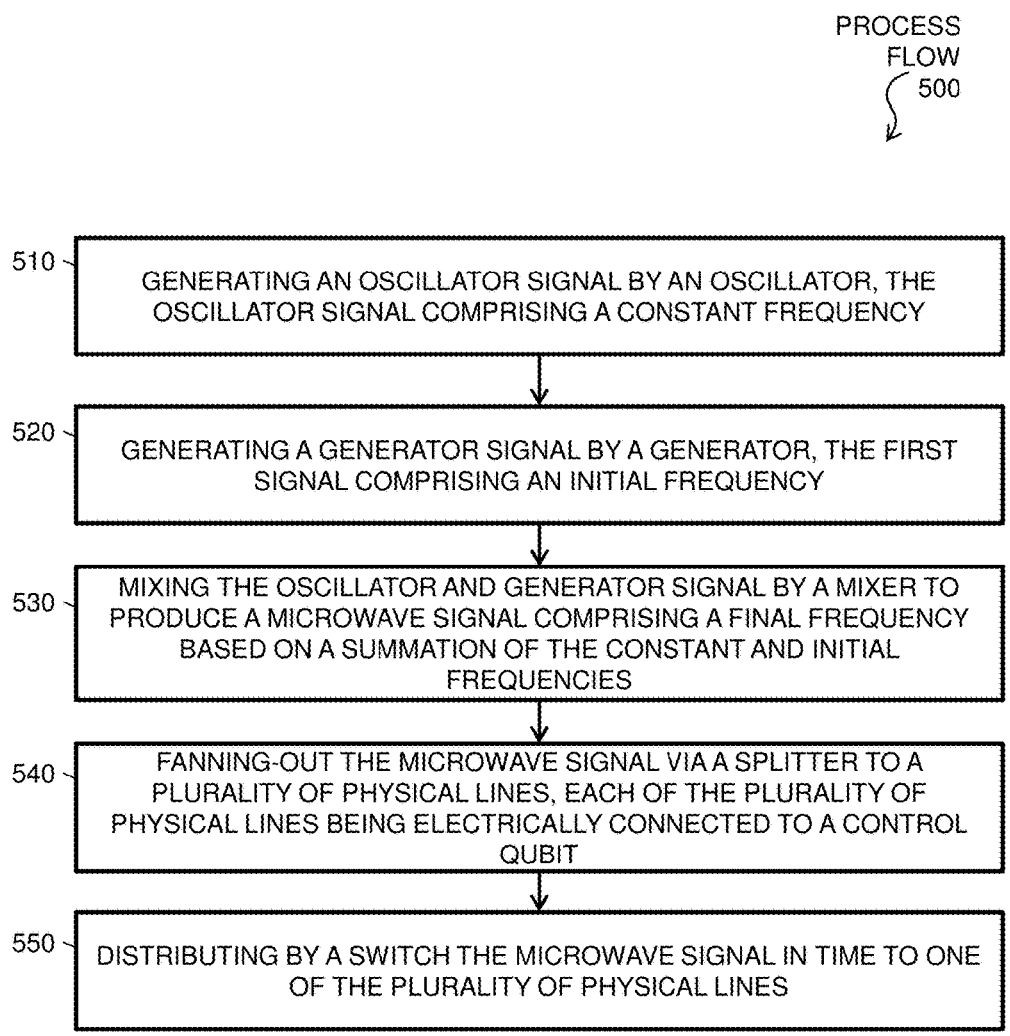
FIG. 5 depicts a process flow of a signal generating system according to one or more embodiments of the present invention.

In view of the above, when using the microwave-controlled CR gate as a two-qubit entangling gate, a quantum processor (e.g., the quantum processor 102) can be engineered such that many of the controlled-NOT gates share the same target qubit. These different CNOT gates are applied at a common frequency and can therefore be generated from a single generator. Turning now to FIGS. 3-5, a quantum computer 300, components therein, and operations performed thereby are now described.

FIG. 3 depicts a diagram of a quantum computer 300 according to one or more embodiments of the present invention. The quantum computer 300 includes a quantum processor 302. The quantum processor 302 includes a plurality of qubits (as shown in FIG. 3, a control qubit 301, a control qubit 302, a control qubit 303, a control qubit 304, and a target qubit 305). Note that the plurality of qubits of FIG. 3 can be implemented as shown by the transmon qubits 215 of FIG. 2. Note also that because the quantum computer 300 is using the microwave-controlled CR gate as a two-qubit entangling gates (not shown), the quantum processor 302 is engineered such that many of the controlled-NOT gates (not shown) of control qubit 301-304 share the same target qubit 305. The quantum computer 300 also includes a signal generating system 310. The signal generating system 310 is electrically coupled to the plurality of qubits (e.g., qubits 301-305) via a plurality of physical lines (as shown in FIG. 3, LINE1, LINE2, LINE3, LINE4, and LINE5). Although shown for illustration, the signal generating system 310 may not necessarily be part of the quantum computer 300 or may be incorporated into the quantum processor 302. In general, the quantum computer 300 exploits its topology to save a large number of channels for an implementation of two-qubit entangling gates (not shown) by utilizing the signal generating system 310, which is described further with respect to FIGS. 4 and 6.

FIG. 4 depicts a diagram of a signal generating system 400 of a quantum computer (e.g., the quantum computer 300 of FIG. 3) according to one or more embodiments of the present invention. The signal generating system 400 includes a generator 410, an oscillator 420, a mixer 430, a splitter 440, and a switch 450. Note that the signal generating system 400 can be considered part of the quantum computer but not part of a quantum processor (e.g., the quantum processor 102) itself.

The generator 410 is a waveform generator and can be an arbitrary waveform generator in accordance with one or more embodiments. An arbitrary waveform generator is a piece of electronic equipment used to generate electrical waveforms, e.g., an arbitrarily defined waveshape as an output or a generator signal (e.g., the first microwave signal) that includes an initial frequency (e.g., a frequency along a range from 100 MHz to 500 MHz). The electrical waveforms of the arbitrary waveform generator can be injected or provided to the mixer 430. The electrical waveform can be defined as a series of "waypoints" (specific voltage targets occurring at specific times along the waveform; i.e., voltage vs time of an arbitrary shape).

The oscillator 420 is an electronic component that generates electrical waveforms, e.g., sinusoidal voltage signals (e.g., the second microwave signal). In this regard, the oscillator 420 can provide the electrical waveforms at a constant frequency (e.g., a frequency along a range from 5 GHz to 10 GHz) to the mixer 430.

The mixer 430 is a nonlinear electrical circuit that creates new frequencies from two signals (e.g., the generator and oscillator signals or the first and second microwave signals) applied to it. In operation, the mixer 430 can be a microwave mixer that produces a final signal (e.g., the third microwave signal) at a sum of frequencies of the oscillator and generator signals, herein referred to as a combined frequency, such as 5 GHz (e.g., the mixer 430 outputs signals that are complex exponentials whose arguments—the frequencies—add when the generator and oscillator signals are multiplied).

The splitter 440 is an electronic component that distributes the final signal. For example, the splitter 440 can be a microwave splitter used for distributing microwave signals. In this regard, the splitter 440 can fan-out the final signal itself. The fanning-out is an action by the splitter that distributes the final signal to each of the plurality of physical lines electrically connected to each control qubit (301-304). Note, however, the switch 450 further controls the fanning out so that only one of the plurality of physical lines (and in turn the only one of the control qubits) receives the final signal.

The switch 450 is an electronic component that includes a plurality of switches for routing signals along one or more transmission paths. In accordance with one or more embodiments, the plurality of switches are open by default, and the switch 450 control the routing by closing one of the plurality of switches. In an example operation, the switch 450 is a microwave switch used to distribute the final signal from the splitter 440 to one of the plurality of physical lines (LINE1, LINE2, LINE3, and LINE4), which are electrically connected to different ports in the quantum computer (300) (i.e., which are further electrically connected to each control qubit (301-304). For instance, the switch 450 enables the signal generating system 400 to route the final signal in time to a single line. In this way, the switch 450 can distribute the right CNOT at the right time for the right qubit pair.

FIG. 5 depicts a process flow 500 of a signal generating system according to one or more embodiments of the present invention. The process flow 500 begins at block 510. That is, at block 510, the oscillator (e.g., the oscillator 420 of FIG. 4) generates an oscillator signal. The oscillator signal can include a constant frequency. At block 520, the generator (e.g., the generator 410 of FIG. 4) generates a generator signal. The generator signal includes an initial frequency. Note that the order in which the generator 410 of FIG. 4 generates the generator signal and the oscillator 420 of FIG. 4 generates the oscillator signal can be reversed or simultaneous.

At block 530, the mixer (e.g., the mixer 430 of FIG. 4) mixes the oscillator and generator signal to produce a microwave signal. The microwave signal can include a combined frequency based on a summation of frequencies within the mixer (e.g. a sum of the constant and initial frequencies). At block 540, the splitter (e.g., the splitter 440 of FIG. 4) fans-out the microwave signal to a plurality of physical lines, each of the plurality of physical lines (e.g., LINE1, LINE2, LINE3, and LINE4 of FIG. 4) being electrically connected to a control qubit (e.g., the control bits 301-304 of FIG. 3). At block 550, the switch (e.g., the switch 450 of FIG. 4) distributes the microwave signal in time to one of the plurality of physical lines (e.g., LINE1, LINE2, LINE3, and LINE4 of FIG. 4). That is, the microwave signal is provided by the switch 450 'in time' or consistent with the program input gate sequence.

Figure 6:
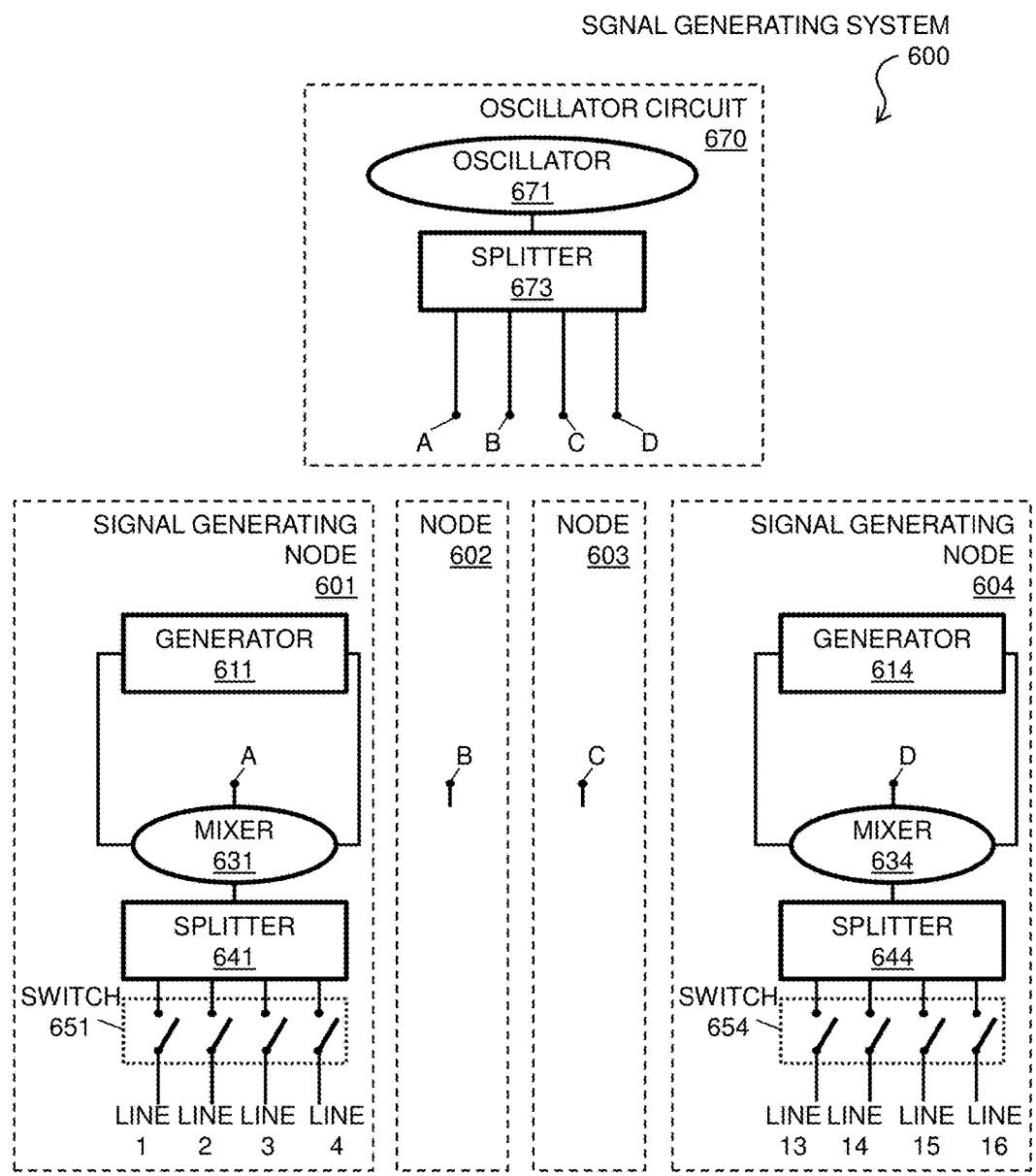
FIG. 6 depicts a diagram of a signal generating system according to one or more embodiments of the present invention.
Figure 7:
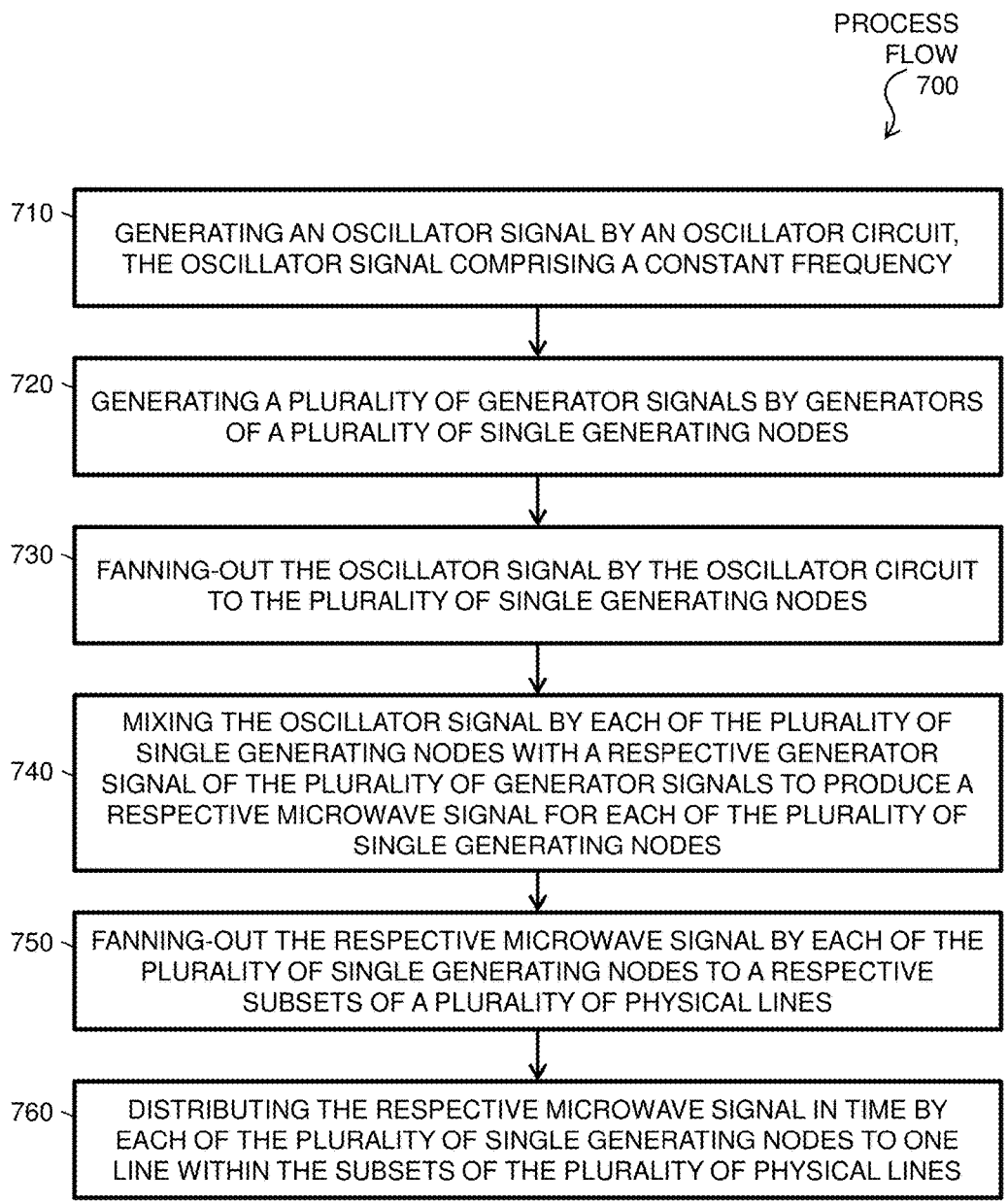
FIG. 7 depicts a process flow of a signal generating system according to one or more embodiments of the present invention.

Turning now to FIGS. 6-7, a signal generating system 600, components therein, and operations performed thereby are now described in accordance with one or more embodiments of the present invention. FIG. 6 depicts a diagram of the signal generating system 600 of a quantum computer (e.g., the quantum computer 300 of FIG. 3) according to one or more embodiments of the present invention.

As shown in FIG. 6, the signal generating system 600 includes a plurality of signal generating nodes 601, 602, 603, and 604. The signal generating nodes 601, 602, 603, and 604 are configured to independently fan-out and distribute microwave signals to a corresponding subset of a plurality of physical lines (e.g., LINE1 through LINE14) as further described herein. Note that for ease of explanation and for simplicity of the FIG. 6, the signal generating nodes 602 and 603 only show the terminals B and C, as the signal generating nodes 602 and 603 generally have the same configuration as the signal generating nodes 610 and 604. Further, note that the signal generating node 602 can fan-out and distribute a microwave signal to one of a subset (e.g., LINE5, LINE6, LINE7, and LINE8, which are not shown) of the plurality of physical lines, and the signal generating node 603 can fan-out and distribute a microwave signal to one of a subset (e.g., LINE9, LINE10, LINE11, and LINE12, which are not shown) of the plurality of physical lines.

For instance, the signal generating node 601 includes a generator 611 that provides a generator signal to the mixer 631, which also receives an oscillator signal from terminal A, as described herein. The generator signal and the oscillator signal are combined at the mixer 631 to provide a microwave signal to the splitter 641 and switch 651, which further fan-out and distribute the microwave signal to one of a subset (e.g., LINE1, LINE2, LINE3, and LINE4) of the plurality of physical lines electrically connected to different ports in the quantum computer (e.g., the quantum computer 300 of FIG. 3).

Similarly, the signal generating node 604 includes a generator 614 that provides a generator signal to the mixer 634, which also receives an oscillator signal from terminal D, as described herein. The generator signal and the oscillator signal are combined at the mixer 634 to provide a microwave signal to the splitter 644 and switch 654, which further fan-out and distribute the microwave signal to one of a subset (e.g., LINE13, LINE14, LINE15, and LINE16) of the plurality of physical lines electrically connected to different ports in the quantum computer (e.g., the quantum computer 300 of FIG. 3).

The signal generating system 600 also includes an oscillator circuit 670. The oscillator circuit 670 can be representative of one or more oscillator circuits. In this regard, each of the one or more oscillator circuits can operate at the same or different frequencies (e.g., at one or more constant frequencies). The oscillator circuit 670 includes an oscillator 671 and a splitter 673. The oscillator 671 can provide electrical waveforms (e.g., the oscillator signal) at a constant frequency via the splitter 673 to each one of the signal generating nodes 601, 602, 603, and 604 via terminal A, B, C, and D, respectively.

FIG. 7 depicts a process flow 700 of a signal generating system (e.g., the signal generating system 600 of FIG. 6) according to one or more embodiments. The process flow 700 begins at block 710.

At block 710, the oscillator circuit (e.g., the oscillator circuit 670 of FIG. 6) generates an oscillator signal. The oscillator signal includes an oscillator frequency. Note that, during a normal operation of a quantum computer, the oscillator signal is typically always on. At block 720, the generators (e.g., the generators 611 and 614 of the signal generating node 601 and 604 and the not shown generators of the signal generating node 602 and 603 of FIG. 6) generate a plurality of generator signals. Each of the generator signals can include an initial frequency that is related to a qubit for which it is destined and may be independent of the other generator signals. For instance, when a gate is required, the generators of the signal generating node 601-604 produce a signal of an adequate frequency and adequate duration.

At block 730, the oscillator circuit (e.g., via the splitter 673 of the oscillator circuit 670 of FIG. 6) fans-out the oscillator signal to the plurality of signal generating nodes (e.g., the signal generating nodes 601, 602, 603, and 604 of FIG. 6). At block 740, each of the plurality of single generating nodes (e.g., the signal generating nodes 601, 602, 603, and 604 of FIG. 6) mixes the oscillator signal with a respective generator signal of the plurality of generator signals to produce a respective microwave signal for each of the plurality of single generating nodes. For example, during idle times, the oscillator signal mixes at the mixer 641 with no signal from the generator 611 as the oscillator signal is typically always on. Further, during normal operations, the mixer 640 multiplies the oscillator signal with the generator signal from the generator 611. Therefore, the oscillator circuit 670 can turn on first and stay on, whereas the generator 610 turns on only when a qubit gate is needed.

At block 750, each of the plurality of single generating nodes (e.g., the signal generating nodes 601, 602, 603, and 604 of FIG. 6) fans-out the respective microwave signal to a respective subsets of a plurality of physical lines. For example, the signal generating node 601 fans-out the respective microwave signal to the physical lines LINE1, LINE2, LINE3, and LINE4 and the signal generating node 604 fans-out the respective microwave signal to the physical lines LINE13, LINE14, LINE15, and LINE16. At block 760, the respective microwave signal are distributed in time by each of the plurality of single generating nodes (e.g., the signal generating nodes 601, 602, 603, and 604 of FIG. 6) to one line within the subsets of the plurality of physical lines.

Thus, the technical effects and benefits of embodiments herein improve the quantum computer by exploiting a topology that saves a large number of channels for an implementation of two-qubit gates, and thus embodiments herein provide an improvement to the quantum computing technology itself by utilizing the signal generating system described herein. The technical effects and benefits of utilizing signal generating system also include reducing the number of arbitrary waveform generators and oscillators due to the use of the splitter, which provides efficiency in wiring of the quantum computer and reduced cost due to splitter being more cost effective than arbitrary waveform generator and oscillators combined. The technical effects and benefits of utilizing signal generating system also include reducing the number of oscillators due to the use of the second splitter, which provides efficiency in wiring of the quantum computer and reduced cost due to splitter being more cost effective than the oscillators.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A signal generating system for providing a microwave signal to a plurality of qubits, the signal generating system comprising:

an oscillator generating an oscillator signal comprising a constant frequency;
a generator generating a generator signal comprising an initial frequency;
a mixer electrically coupled to the generator and the oscillator, the mixer combining the generator and oscillator signals to produce the microwave signal, wherein, during idle times, the oscillator signals mix at the mixer with no signal from the generator and, during normal operations, the mixer multiplies the oscillator signal with the generator signal from the generator;
a splitter electrically coupled to the mixer, the splitter fanning-out the microwave signal to a plurality of physical lines, each of the plurality of physical lines being electrically connected to a corresponding one of the plurality of qubits such that each of the plurality of physical lines is only connected to one qubit; and
a switch electronically coupled to the splitter, the switch distributing the microwave signal in time to one of the plurality of physical lines such that only one of the plurality of qubits receives the microwave signal.

2. The signal generating system of claim 1, wherein the splitter comprises a microwave splitter and the switch comprises a microwave switch.

3. The signal generating system of claim 1, wherein the microwave signal comprises a combined frequency based on a summation of the initial and constant frequencies within the mixer.

4. The signal generating system of claim 1, wherein the generator comprises an arbitrary waveform generator that provides the generator signal to the mixer.

5. The signal generating system of claim 1, wherein the generator signal is defined by a voltage vs time of an arbitrary shape.

6. A signal generating method for providing a microwave signal to a plurality of qubits, the signal generating method comprising;
generating, by an oscillator, an oscillator signal comprising a constant frequency;
generating, by a generator, a generator signal comprising an initial frequency;
combining, by a mixer electrically coupled to the generator and the oscillator, the generator and oscillator signals to produce the microwave signal, wherein, during idle times, the oscillator signals mix at the mixer with no signal from the generator and, during normal operations, the mixer multiplies the oscillator signal with the generator signal from the generator;
fanning-out, by a splitter electrically coupled to the mixer, the microwave signal to a plurality of physical lines, each of the plurality of physical lines being electrically connected to a corresponding one of the plurality of qubits such that each of the plurality of physical lines is only connected to one qubit; and
distributing, by a switch electrically coupled to the splitter, the microwave signal in time to one of the plurality of physical lines such that only one of the plurality of the qubits receives the microwave signal.

7. The signal generating method of claim 6, wherein the splitter comprises a microwave splitter and the switch comprises a microwave switch.

8. The signal generating method of claim 6, wherein the microwave signal comprises a combined frequency based on a summation of the initial and constant frequencies within the mixer.

9. The signal generating method of claim 6, wherein the generator comprises an arbitrary waveform generator that provides the generator signal to the mixer.

10. The signal generating method of claim 6, wherein the generator signal is defined by a voltage vs time of an arbitrary shape.

11. A quantum computer comprising:
a plurality of qubits;
a plurality of physical lines, each of the plurality of physical lines being electrically connected to a corresponding one of the plurality of qubits such that each of the plurality of physical lines is only connected to one qubits; and
a signal generating system providing a microwave signal to the plurality of qubits,
the signal generating system comprising:
an oscillator generating an oscillator signal comprising a constant frequency;
a generator generating a generator signal comprising an initial frequency;
a mixer electrically coupled to the generator and the oscillator, the mixer combining the initial and oscillator signals to produce the microwave signal, wherein, during idle times, the oscillator signals mix at the mixer with no signal from the generator and, during normal operations, the mixer multiplies the oscillator signal with the generator signal from the generator;
a splitter electrically coupled to the mixer, the splitter fanning-out the microwave signal to the plurality of physical lines; and
a switch electronically coupled to the splitter, the switch distributing the microwave signal in time to one of the plurality of physical lines such that only one of the plurality of qubits receives the microwave signal.

12. The quantum computer of claim 11, wherein the splitter comprises a microwave splitter and the switch comprises a microwave switch.

13. The quantum computer of claim 11, wherein the microwave signal comprises a combined frequency based on a summation of the initial and constant frequencies within the mixer.

14. The quantum computer of claim 11, wherein the generator comprises an arbitrary waveform generator that provides the generator signal to the mixer.

15. The quantum computer of claim 11, wherein the generator signal is defined by a voltage vs time of an arbitrary shape.

16. A quantum computer comprising:
a plurality of qubits;
a plurality of physical lines, each of the plurality of physical lines being electrically connected to a corresponding one of the plurality of qubits;
a plurality of signal generating nodes each independently providing a respective microwave signal in time to at least one of the plurality of qubits; and
an oscillator circuit electrically coupled to the plurality of signal generating nodes, the oscillator circuit generating an oscillator signal comprising a constant frequency,
each of the signal generating nodes comprising:
a generator generating a generator signal;
a mixer electrically coupled to the generator and the oscillator circuit, the mixer combining the generator and the oscillator signal to produce the respective microwave signal, wherein, during idle times, the oscillator signals mix at the mixer with no signal from the generator and, during normal operations, the mixer multiplies the oscillator signal with the generator signal from the generator;

a splitter electrically coupled to the mixer, the splitter fanning-out the respective microwave signal to a subset of the plurality of physical lines such that each of the plurality of physical lines is only connected to one qubit; and a switch electrically coupled to the splitter, the switch distributing the respective microwave signal in time to one of the subset of the plurality of physical lines such that only one of the plurality of qubits receives the respective microwave signal.

17. The quantum computer of claim 16, wherein the microwave signal comprises a combined frequency based on a summation of frequencies within the mixer.

18. The quantum computer of claim 16, wherein the generator signal is defined by a voltage vs time of an arbitrary shape.

19. A signal generating method for providing a plurality of microwave signals to a plurality of qubits, the signal generating method comprising:

generating, by an oscillator circuit, an oscillator signal comprising a constant frequency;

generating, by a plurality of signal generating nodes, a plurality of generator signals; and fanning-out, via a splitter of the oscillator circuit, the oscillator signal to the plurality of signal generating nodes;

mixing, by each of the plurality of signal generating nodes, the oscillator signal received from the oscillator circuit and a respective generator signal of the plurality of generator signals to produce the plurality of microwave signals, wherein, during idle times, the oscillator signals are mixed with no signal from the generator and, during normal operations, the mixer the oscillator signal is multiplied with the generator signal; and fanning-out and distributing, by the plurality of signal generating nodes, each of the plurality of microwave signals in time to one line within a respective subset of a plurality of physical lines, wherein each of the plurality of physical lines are electrically connected to only one of the plurality of qubits such that each of the plurality of microwave signals is only received by a respective one of the plurality of qubits.

20. The signal generating method of claim 19, wherein the microwave signal comprises a combined frequency based on a summation of frequencies within the mixer.

* * * * *